United States Patent [19]

Liu et al.

[11] Patent Number: 4,965,579

[45] Date of Patent: Oct. 23, 1990

[54] N-BIT A/D CONVERTER UTILIZING N COMPARATORS

[75] Inventors: Gang Liu, Detroit; Hanchi Huang, Sterling Heights; Pepe Siy, Dearborn Heights; Michael P. Polis, Grosse Pointe Park, all of Mich.

[73] Assignee: The Board of Governors of Wayne State University, Detroit, Mich.

[21] Appl. No.: 276,700

[22] Filed: Nov. 28, 1988

[51] Int. Cl.$^5$ .............................................. H03M 1/36
[52] U.S. Cl. ..................................... 341/159; 341/158
[58] Field of Search ........................ 341/159, 158, 155

[56] References Cited

U.S. PATENT DOCUMENTS

| | | | |
|---|---|---|---|
| 3,611,350 | 10/1971 | Leibowitz et al. | 340/347 AD |
| 3,829,853 | 8/1974 | Freedman | 340/347 AD |
| 4,275,386 | 6/1981 | Michel et al. | 340/347 AD |
| 4,551,817 | 11/1985 | Ishikawa | 364/811 |
| 4,580,227 | 4/1986 | Lavergnat et al. | 364/487 |
| 4,596,978 | 6/1986 | Fujita | 340/347 AD |
| 4,600,916 | 7/1986 | Masuda et al. | 340/347 AD |
| 4,608,555 | 8/1986 | Hoeft | 340/347 AD |
| 4,649,371 | 3/1987 | Kolluri | 340/347 AD |
| 4,660,166 | 4/1987 | Hopfield | 364/807 |
| 4,719,591 | 1/1988 | Hopfield et al. | 364/807 |
| 4,769,628 | 9/1988 | Hellerman | 341/162 |

OTHER PUBLICATIONS

G. B. Clayton, "Analog to Digital Conversion Techniques," Data Converters, Chap. 3, pp. 40-79 (John Wiley & Sons, New York, 1982).

G. M. Glasford, Analog Electronic Circuits, Chap. 10, pp. 448-464 (Prentice-Hall, Englewood Cliffs, N.J., 1986).

D. W. Tank & J. J. Hopfield, "Simple 'Neural' Optimization Networks: An A/D Converter, Signal Decision Circuit, and a Linear Programming Circuit", IEEE Transaction on Circuits and Systems, vol. CAS-33, No. 5, May 1986, pp. 533-541 (May, 1986).

J. J. Hopfield & D. W. Tank, "Computing with Neural Circuits: A Model", Science, vol. 233, pp. 625-633 (Aug. 8, 1986).

T. Kohonen, "Computing with Neural Networks", Science, vol. 235, pp. 1226-1227 (Mar. 6, 1987).

B. W. Lee & B. J. Sheu, "An Investigation on Local Minima of Hopfield Network for Optimization Circuits", proceedings of IEEE International Conference on Neuro Networks, San Diego, CA, Jul. 24-27, 1988, pp. 1-45 to 1-51.

Primary Examiner—William M. Shoop, Jr.
Assistant Examiner—Sharon D. Logan
Attorney, Agent, or Firm—Harness, Dickey & Pierce

[57] ABSTRACT

A parallel analog-to-digital ("A/D") converter utilizing only N comparators and at least N−1 summing networks made of the simple resistance elements. The A/D conversion process operates asynchronously without need for registers, a clock circuit or latches and determines at a high rate of speed the N output bits for a given analog input signal. Each of the summing networks produces a composite analog signal which is fed into a respective one of the comparators. The digital output bit produced by each comparator is fed into the summing networks associated with those comparators whose output bits are less significant. Accordingly, when all output bits are changing on account of a new analog input value, the converter determines the most significant bit first, the next most significant bit next, and so on, until the least significant bit is determined. Because only simple resistive elements need be used in the summing circuit, the performance of the converter is determined principally by the switching speed of the comparators. The summing networks receive voltage inputs and produce an analog voltage output in accordance with weights which vary from one another by a predetermined power of two, as is established by the relative conductance of the resistance elements.

21 Claims, 3 Drawing Sheets

| $V_A$ | $N_3$ | $N_2$ | $N_1$ | $N_0$ | $V_3$ | $V_2$ | $V_1$ | $V_0$ |
|---|---|---|---|---|---|---|---|---|
| 0 TO 1- | -8 | -4 | -2 | -1 | 0 | 0 | 0 | 0 |
| 1 TO 2- | -7 | -3 | -1 | 0 | 0 | 0 | 0 | 1 |
| 2 TO 3- | -6 | -2 | 0 | -1 | 0 | 0 | 1 | 0 |
| 3 TO 4- | -5 | -1 | 1 | 0 | 0 | 0 | 1 | 1 |
| 4 TO 5- | -4 | 0 | -2 | -1 | 0 | 1 | 0 | 0 |
| 5 TO 6- | -3 | 1 | -1 | 0 | 0 | 1 | 0 | 1 |
| 6 TO 7- | -2 | 2 | 0 | -1 | 0 | 1 | 1 | 0 |
| 7 TO 8- | -1 | 3 | 1 | 0 | 0 | 1 | 1 | 1 |
| 8 TO 9- | 0 | -4 | -2 | -1 | 1 | 0 | 0 | 0 |
| 9 TO 10- | 1 | -3 | -1 | 0 | 1 | 0 | 0 | 1 |
| 10 TO 11- | 2 | -2 | 0 | -1 | 1 | 0 | 1 | 0 |
| 11 TO 12- | 3 | -1 | 1 | 0 | 1 | 0 | 1 | 1 |
| 12 TO 13- | 4 | 0 | -2 | -1 | 1 | 1 | 0 | 0 |
| 13 TO 14- | 5 | 1 | -1 | 0 | 1 | 1 | 0 | 1 |
| 14 TO 15- | 6 | 2 | 0 | -1 | 1 | 1 | 1 | 0 |
| 15 TO 16 | 7 | 3 | 1 | 0 | 1 | 1 | 1 | 1 |

N-BIT A/D CONVERTER UTILIZING N COMPARATORS

FIELD OF THE INVENTION

The present invention relates generally to electronically operated parallel analog-to-digital ("A/D") converters and specifically to solid-state parallel A/D converters using N comparators.

BACKGROUND OF THE INVENTION

Most sensing devices such as temperature, pressure, level or flow rate sensors yield signals which are analog in nature. Usually, these analog signals are continuous over some normally predetermined range. In order to use digital computing devices to process these signals, they must be transformed to digital or discrete signals. This process is known as analog-to-digital conversion and the circuits or devices used to perform this conversion are called A/D converters. Digital computers, particularly microcomputers, on account of their flexibility, programmability, and accuracy are now emerging as a desirable solution to many control problems. In many applications, it is either highly desirable or necessary to perform A/D conversion very quickly, and to present the digital output signals in parallel form to a bus or other multiple conductor data highway connected to a digital computer. Such applications include automobile engine, brake and transmission control systems, image processing, process control, radar, data acquisition and logging, and the like.

There are several parallel A/D converter structures which have been proposed, and a few are currently being used commercially. Each structure possesses certain advantages and disadvantages with respect to speed (that is, conversion time), precision, power consumption, cost, number of bits achievable by the state of the art, and the like. One widely used structure is a parallel A/D converter which requires $2^N - 1$ or more comparators in the circuit to achieve an N-bit converter. Thus, to realize an 8-bit converter requires 255 or more comparators. Examples of such converters are shown in the following four U.S. patents:

| U.S. Pat. No. | Inventor(s) |
| --- | --- |
| 3,611,350 | Leibowitz |
| 3,829,853 | Freedman |
| 4,596,978 | Fujita |
| 4,600,916 | Masuda et al. |

This now-conventional style of converter requires far more than N comparators to produce an N-bit A/D conversion, and requires many other accurate components as well. Due to the formidable practical difficulties associated with implementing large amounts of precision circuitry and many comparators, the use of such parallel converters to achieve A/D conversion for large N is still very limited. Expense considerations and the upper limit on how many components can be practically integrated in a single integrated circuit (IC) chip also limit the use and maximum precision of such converters.

Another well-known approach to analog-to-digital conversion is the successive approximation technique of which the A/D converter shown in U.S. Pat. No. 4,649,371 to Kolluri is an example. The structure disclosed therein operates synchronously and requires at least N clock cycles to complete a conversion, and in addition also requires electronic hardware such as one or more registers. An additional explanation of this technique and other A/D techniques is Provided in G.B. Clayton, "Analog to Digital Conversion Techniques", DATA CONVERTERS, Chap. 3, pp. 40–79 (John Wiley & Sons, N.Y., 1982).

Several designs have been proposed for parallel A/D converters using N or 2N comparators. The following five patents uncovered during a preliminary patent search disclose such parallel A/D converter structures:

| U.S. Pat. No. | Inventor(s) |
| --- | --- |
| 4,275,386 | Michel et al. |
| 4,608,555 | Hoeft |
| 4,660,166 | Hopfield |
| 4,718,591 | Hopfield et al. |
| 4,769,628 | Hellerman |

The Michel et al patent, the Hoeft patent and the Hellerman patent each disclose the concept of using an asynchronous parallel A/D converter which has only N comparators. Each of the disclosed converters may be said to utilize a modified successive approximation technique wherein the value of the highest order digit of the analog input signal is discerned first, followed by the discernment of the next most significant bit and so on, on down to the unit bit. The converters in the Michel et al patent and the Hoeft patent require the use of precision current sources. The Michel et al converter also requires the use of a two-position switch with each comparator and voltage reference values provided by a diode network or the like. The converter in the Hoeft patent also requires the use of N current dividers, a voltage-to-current converter and current splitter. The converter in the Hellerman patent also requires the use of a solid-state switch with each comparator. These additional components add to the complexity of and limit the number of bits of resolution of these designs.

Another approach to parallel A/D converters is provided in U.S. Pat. Nos. 4,660,166 to J.J. Hopfield and U.S. Pat. No. 4,719.591 to J.J. Hopfield and D.W. Tank, and in the following two journal articles: D.W. Tank and J.J. Hopfield, "Simple Neural Optimization Networks: An A/D Converter, Signal Decision Circuit, and a Linear Programming Circuit", *IEEE Transactions of Circuits and Systems*, Vol CAS-33, No. 5, pp. 533–541 (May, 1986), and J.J. Hopfield and D.W. Tank, "Computing With Neural Circuits: A Model" Science. Vol. 233, pp. 625–633 (Aug. 8, 1986). The A/D converter designs disclosed in these references by Hopfield and/or Tank are somewhat similar in topography to that of the converters of the present invention. However, as is noted in first journal article, their A/D converter is unable to guarantee an accurate result for all analog input values, unless the input signal to the converter is momentarily reset to zero before the circuit is put to work.

The foregoing problem with the Hopfield A/D converter is also noted in another reference, namely B. Lee and B. Sheu, "An Investigation of Local Minima of Hopfield Networks for Optimization Circuits", *Proceedings of the 1988 IEEE Int'l. Conf. On Neural Networks*, pp. 1-45 to 1-51 (San Diego, Calif., July 24-27, 1988). These authors propose an add-on circuit to eliminate the localized conditions or traps that the Hopfield A/D converter can get into. However, add-on circuitry further increases the number of comparators required and the overall complexity of the circuitry and interconnections.

In light of the foregoing comments, it is clear that there still remains a need for a simple, low cost and reliable parallel A/D converter capable of operating at high speeds and with high precision, that is with many bits. In particular, there is a need for such an A/D converter which requires relatively few components, is inexpensive and which does not require precision current sources, solid-state switches or other complicated components for the A/D conversion process that tend to limit the ultimate accuracy or expandability of an A/D converter.

Therefore, it is a principal object of the present invention to provide a N-bit asynchronous high-speed parallel A/D converter including only N comparators and having minimal structural complexity and maximum reliability.

It is a related object of the invention to provide an A/D converter which uses few components especially a minimum number of active components, is very economical to produce, draws a minimum amount of power, is very reliable and is easy to manufacture using integrated circuit technology.

It is another object of the present invention to provide an A/D converter design which can be readily expanded, on account of minimum number of components and its design simplicity, to a greater number of bits in the digital output than is practical using well-known conventional A/D converter designs.

It is further an object of the present invention to provide a parallel A/D converter design which can be used to handle either unipolar or bipolar analog input signals.

SUMMARY OF THE INVENTION

In light of the foregoing objects, there is provided according to one aspect of the present invention, an analog-to-digital converter for producing N binary outputs $A_0$ through $A_{N-1}$ in parallel representing the digital value that is equivalent to the analog input signal, N being a positive integer having a value of at least three. The converter of this first embodiment comprises: N comparator means for respectively producing binary outputs $A_0$ through $A_{N-1}$, wherein output $A_0$ is the least significant bit and output $A_{N-1}$ is the most significant bit; and at least N-1 summing means, each such summing means being for producing an analog output signal equal to a weighted sum of input signals received thereby. In this embodiment, each of the N comparator means has input means for receiving a weighted sum of input values. Also, each of the N-1 summing means is associated with and has its analog output connected to a respective distinct one of the N comparator means. The weighted sum of each such summing means includes a predetermined portion of the analog input signal, a predetermined portion of a reference signal, and a predetermined portion of each binary output from only those comparator means whose binary outputs are more significant than the binary output of the comparator means to which the summing means is connected.

Preferably, in each weighted summing means, the predetermined portions of each binary output included as part of the weighted sum produced by the summing means vary as a power of two relative to one another.

In the most preferred embodiment, when the predetermined weight of the analog input signal is deemed to be unity, the predetermined portion of the reference signal is directly proportional to the relative significance of the binary output of the comparator means to which the summing means is connected.

According to a second aspect of the present invention, there is provided an asynchronous analog-to-digital converter for producing at least four binary outputs $A_0$ through $A_3$ in parallel from an analog input signal and a reference signal. In this embodiment, the converter comprises: first, second, third and fourth comparators respectively having and producing binary outputs $A_0$, $A_1$, $A_2$, and $A_3$ and first, second, third and fourth resistance networks respectively having output nodes $N_0$, $N_1$, $N_2$ and $N_3$. The output $A_0$ is the least significant bit and the output $A_3$ is the most significant bit. Each comparator has a first input and a second input with each of the first inputs being connected to and receiving the analog input signal. The second input of these dual input comparators is connected and receives signals as follows. The fourth comparator is connected and receives the reference signal. The first, second, and third resistance networks have output nodes $N_0$, $N_1$ and $N_2$ respectively connected to the second inputs of the first, second and third comparators. The first resistance network has four input nodes respectively connected to the reference signal and outputs $A_1$, $A_2$ and $A_3$. The first resistance network also has four resistance elements each connected on one side thereof to the node $N_1$ and on the other side thereof respectively to a distinct one of these four input nodes. The second resistance network has three input nodes respectively connected to the reference signal and the outputs $A_2$ and $A_3$. The second resistance network also has three resistance elements each of which is connected on one side thereof to the node $N_2$ and on the other side thereof respectively to a distinct one of these three input nodes. The third resistance network has two input nodes respectively connected to the reference signal and the output $A_3$. It also has two resistance elements each connected on one side thereof to the node $N_3$ and on the other side thereof respectively to a distinct one of these two input nodes.

In a preferred version of the second embodiment of the A/D converter of the present invention, each comparator may be a differential input operational amplifier with positive and negative inputs. The first input of each comparator constitutes one of these inputs of the comparator, and the second input constitutes the other of these inputs of the comparator. If desired, the comparators may be driven by both positive and negative supply voltages. Also the analog signal may be a voltage which varies over between substantially the entire output range of the comparators.

These and other aspects, objects, features and advantages of the present invention will be more readily understood upon reading the detailed description of the preferred embodiments set forth below in conjunction with the attached drawings and subjoined claims.

BRIEF DESCRIPTION OF THE DRAWINGS

In the accompanying Figures, where like items and features are identified by identical reference numerals in the various Figures.

DETAILED DESCRIPTION OF THE PREFERRED EMBODIMENTS

Figure 1:
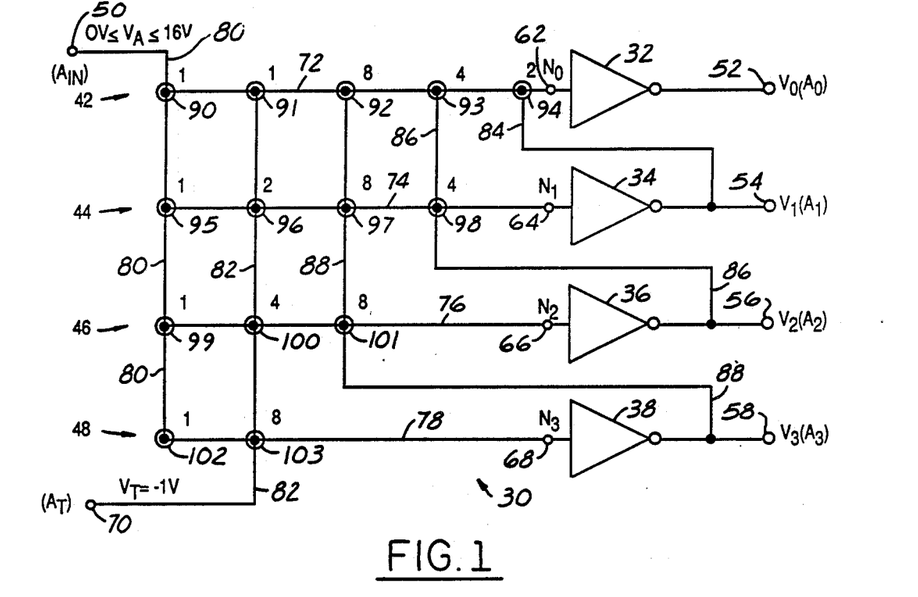
FIG. 1 is a stylized schematic diagram of a first embodiment of a four-bit parallel A/D converter of the present invention which shows the four comparators and the four summing networks used therein.

Referring now to FIG. 1, there is shown an asynchronous parallel A/D converter 30 of the present invention. The converter 30 includes four identical comparators 32, 34, 36 and 38 and four summing means or networks 42, 44, 46 and 48. The analog input signal $A_{IN}$ is provided at terminal 50 and may be for example, a voltage signal VA ranging in value from 0 volts to 16 volts (which equals 24 volts) The four bits or signals of digital outputs $A_0$, $A_1$, $A_2$ and $A_3$ are provided at terminals 52, 54, 56 and 58. For ease of identification and future discussion, the output nodes of the summing networks 42, 44, 46 and 48 are shown as terminals 62, 64, 66 and 68.

The A/D converter 30 also utilizes a reference signal $A_T$ which is preferably a voltage signal $V_T$ which may be set to $-1$ volt, and is input at terminal 70. The four horizontal lines 72, 74, 76 and 78 represent the summing or output lines of summing networks 42–48 and are respectively connected to terminals 62–68. Vertical lines 80 and 82 originate respectively at input signal terminal 50 and reference signal terminal 70 and are connected to all of the summing networks 42–48. The three remaining vertical lines 84, 86 and 88 represent feedback paths which originate respectively from the outputs of comparators 34, 36 and 38. The output of comparator 38 represents the most significant bit, and is delivered to those summing networks associated with comparators whose outputs are less significant than that of comparator 38. Accordingly, vertical line 88 is connected to summing networks 42–46. Similarly, the second most significant output, which originates from comparator 36, is connected to those summing means associated with all comparators whose outputs are less significant than that of comparator 36, namely summing networks 42 and 44. Following the same pattern, the output of comparator 34 is only connected to the summing network 42. The output of comparator 32 is not fed back to any other portion of the circuit.

The junctions or intersections of the horizontal lines and vertical lines are marked with a "multiplication junction" symbol, namely a circle with a dot therein, as typified by symbol 100 at the intersection of horizontal line 76 and vertical line 82, which represents a multiplication function and an electrical connection. There are fourteen multiplication junctions in converter 30 which are identified by reference numerals 90 through 103. The number to the upper right of each of these junction is a multiplication value. The signal from the vertical line connected to a multiplication junction is multiplied by the value indicated to the upper right of the symbol before that signal is summed with the other signals present upon the horizontal line to which it is connected.

Figure 2:
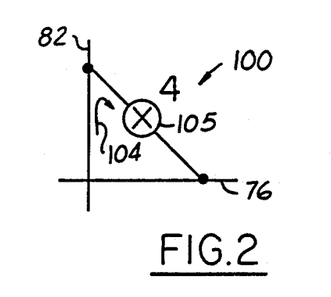
FIG. 2 is a representation of one of the nodes of one of the summing networks.

The operation of a typical multiplication junction may be more clearly understood by the typical multiplication junction 100 shown in FIG. 2. The flow of the signal from vertical line 82 is represented by arrow 104 which shows that the signal passes through multiplier element 105 having a multiplication value of four, and then is passed to horizontal line 76. The multiplication function of element 105 can be realized very easily by using a simple resistance network, as will be further explained with respect to FIG. 6.

Figure 3:
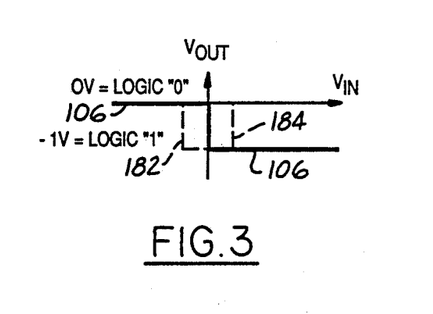
FIG. 3 is a graph showing the input/output characteristics of the comparator used in the FIG. 1 converter.
Figure 4:
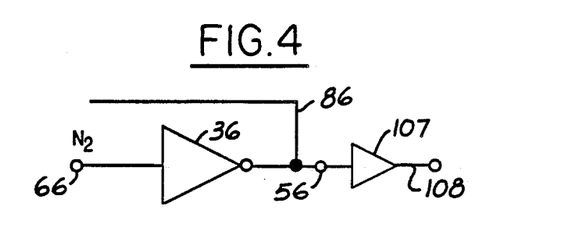
FIG. 4 is a detailed view showing an amplifier connected to a comparator to translate the output of the comparator to standard digital logic levels.

Each of the comparators 32–38 has a voltage-in/voltage-out transfer function as shown by the heavy line 106 in FIG. 3. Thus when the input voltage to a comparator is less than zero, that comparator has a zero volt output. When the input voltage is zero volts or higher, the output voltage switches to a $-1$ volt level. The comparators 32–38 may be implemented in any conventional or suitable manner, preferably using a design which automatically compensates for operating temperature variations and the effects of long-term drift due to aging of internal components therein. As shown in FIG. 3, the zero volt output value is considered a logic "0" and the $-1$ volt output value is considered a logic "1". If more conventional logic values are desired, such as zero volts for a logic 0 and $+5$ volts for a logic 1, then a suitable amplifier may be added to the output of each comparator 32–38. This is illustrated by the circuit example of FIG. 4, which shows such an amplifier 107 connected to the output of comparator 36. The design of level-shifting amplifiers is well-known and need not be explained here. If desired, the amplifier 107 could operate as a comparator, that is have a nonlinear or step-function input/output characteristic. When the input was at or near zero volts the output 108 of amplifier 107 would be zero volts, and when its input was at or anywhere near $-1$ volt, the output would be $+5$ volts. Those skilled in the art would readily appreciate that other transfer functions may be employed so as to convert the zero volt and $-1$ volt values output by comparators 32–38 to any desired set of logic levels such as zero volts and $+15$ volts, as might be required for a high level positive true logic system.

Figure 5:
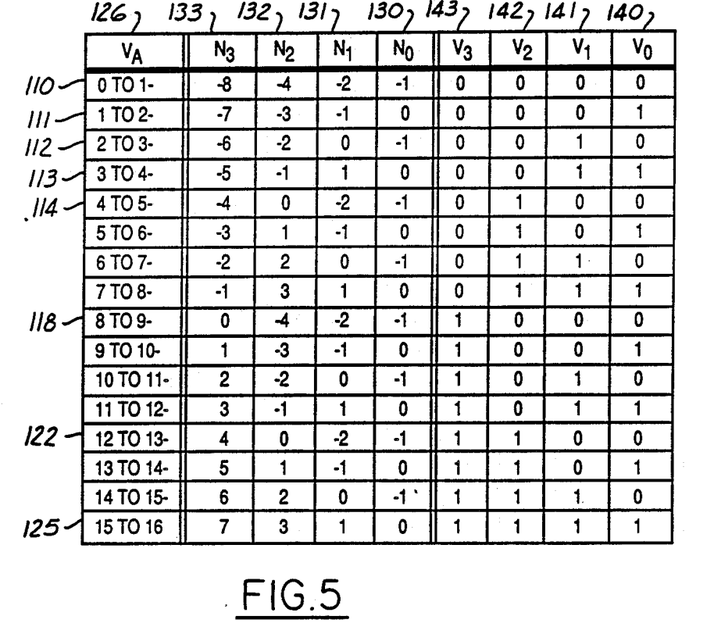
FIG. 5 is a table which shows the output state of each of the four summing networks and the four comparators in FIG. 1 converter as a function of the analog input voltage $V_A$.

Armed with the foregoing explanation, the operation of the FIG. 1 converter circuit will now be explained with the assistance of table 109 shown in FIG. 5 which has rows 110 through 125. The first column 126 in table 109 represents the input voltage $V_A$, which for convenience has been broken into sixteen distinct ranges from zero volts to 15 volts in one volt increments. The minus sign after the second number in each row of column 126 means that the range of that row extends to a value just under the value of that second number. The four columns 130 through 133 represent the values of the weighted sums produced by summing networks 42–48 at nodes $N_0$ through $N_3$ for each of the sixteen different input values indicated by the first number in each row of column 126. The four columns 140–143 indicate the binary output values $V_0$ through $V_3$ produced by comparators 32–38 in response to the analog input signal $V_A$ in each of the ranges specified in the rows of column 126. It should be noted that the outputs step as expected from a hexadecimal value of zero to a hexadecimal value of "F" (that is, the binary value "1111").

The operation of the A/D converter 30 may be understood by considering the results produced by the most significant stage of converter 30, which is comprised of comparator 38 and summing network 48. When the analog input voltage is zero, the only non-zero input received on line 78 is a "−8" value on account of multiplier junction 103 multiplying the −1 volt on line 82 by 8. As the analog voltage is increased to four volts, for example, as indicated in row 114 of the FIG. 5 table, the value of the summing network output $N_3$ is decreased to −4 volts, since the −8 volts delivered through junction 103 is offset by the +4 volts delivered through junction 48. When the input voltage $V_A$ is 8 volts or more, the output $N_3$ of the network 48 is 0 volts or more, and the output $V_3$ of comparator 38 switches from a logic 0 state to a logic 1 state.

The operation of the summing network 46 is similarly explained by the entries in the "$N_2$" column of table 109. As shown in rows 110–113, the output node $N_2$ changes from −4 volts to −1 volt as the analog input voltage $V_A$ changes from 0 volts to 3 volts. During this transition the output voltage $V_2$ of comparator 36 remains in a logic 0 state on account of the influence of the −4 value delivered through multiplication junction 100. When the analog input voltage is between 4 volts and 7 volts as indicated in rows 114–117, the output $V_2$ switches to its logic 1 state since the analog input voltage $V_A$ now exceeds the −4 signal supplied to junction 100. As shown in row 118, the output $V_2$ switches to 0 volts when output $V_3$ of comparator 38 assumes its logic 1 state on account of the −8 value delivered through summing junction 101. It is not until the analog input voltage $V_A$ reaches 12 volts as shown in row 122 that the output $V_2$ switches to a logic 1 state again. The operation of the summing junctions 42 and 44 associated with comparators 32 and 34 may be similarly understood by the entries in columns 130, 140 and 131, 141 of table 109.

Figure 6:
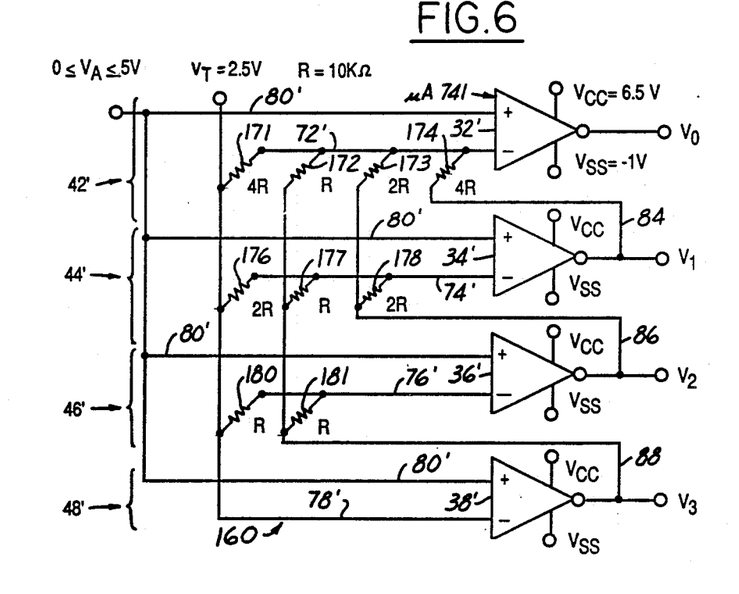
FIG. 6 is a detailed schematic diagram for a second embodiment of a four-bit parallel A/D converter of the present invention which accepts an analog input signal and utilizes dual-input differential comparators.

FIG. 6 shows a practical 4-bit parallel A/D converter 160 of the present invention which has been designed and constructed in accordance with the basic principles of operation inherent in the FIG. 1 circuit. This converter 160 may also be said to represent a second embodiment of the present invention in that its comparators 32′–38′ are of the differential input type instead of the type with one input.

Figure 7:
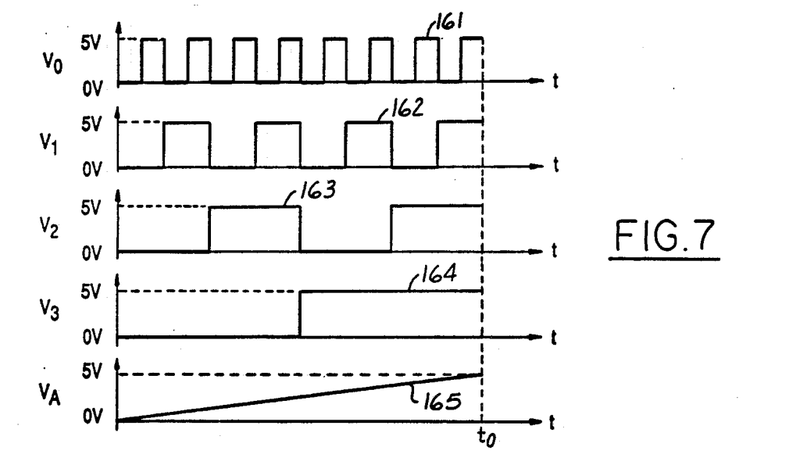
FIG. 7 is a graph which shows the output state of each of the four comparators in the FIG. 6 converter as a function of the analog input voltage VA.

An experiment with a prototype of converter 160 has shown that the digital outputs achieved are precisely those desired for an ideal A/D converter. FIG. 7 shows the waveforms achieved for digital outputs $V_0$, $V_1$, $V_2$ and $V_3$ respectively for an analog input $V_A$, as shown by waveforms 161 through 165 which are drawn along a common time line. In our experiment, the input voltage $V_A$ was the triangle waveform 166 shown in FIG. 8. In response to waveform 166 every comparator output changes from 0 volts, which represents the logic 0 state, to 5 volts which represents the logic 1 state when it is supposed to. Our prototype circuit 160 used resistors each having a value of 10 kilo-ohms, but almost any value of resistance R may be used so long as the relative resistance (or conductance) ratios between the various resistance elements indicated in FIG. 6 are maintained. The comparator supply voltages $V_{cc}$ and $V_{ss}$ were 6.5 volts and −1 volts respectively. Any suitable differential input comparator may be used for this prototype circuit 160 such as an operational amplifier No. uA741. Returning now to the FIG. 6, the A/D converter 160 includes three summing networks 42′, 44′ and 46′. The wiring indicated by reference numeral 48′ is not a separate summing network, since the operation of comparator 38′ effectively performs the summing function previously performed by junctions 102 and 103 in network 48 of FIG. 1. Similarly, the multiplication junctions associated with vertical line 80 in FIG. 1 are no longer necessary since the analog input signal $V_A$ goes directly to the positive input of each of the differential comparators 32′–38′. Resistors 171–174, 176–178 and 180–181 respectively perform the multiplication function indicated in FIG. 1 by multiplication junctions 91–94, 96–98 and 100–101.

The summing networks 42′–46′ may thus be called resistance networks. The reference voltage $V_T$ used for the prototype of converter 160 is 2.5 volts, which is the midpoint value of the nominal range (i.e., 0 V to 5 V) of the analog input signal. The differential input portion of the comparators may be said to form part of the summing networks 42′–48′ as is well-known since the differential inputs essentially perform a mathematical summing operation when used as shown. It will be noted that the negative input also effectively performs an inversion operation. This may be understood by noting that in the FIG. 1 device, the logic 1 state was represented by −1 volts as shown in FIG. 3. Since the logic 1 state in the FIG. 6 device is represented by a positive, rather than negative voltage, it is necessary to invert the value of the feedback inputs delivered via line 84–88 to the summing network 42′–46′. Since the negative input of each of the comparators 32′–36′ are subtracted from their respective positive inputs, this effectively performs the necessary inversion operation. The different multiplication values required by the multiplication junctions are achieved simply by varying the resistance values among the resistors 171–181. Specifically, it should be noted that the conductances of the resistors in each of the summing networks 42′–46′ vary in accordance with the multiplication values indicated in FIG. 1. For example, in the resistance network 42′, the resistors 172, 173 and 174 in the feedback paths corresponding to the multiplication junctions 92, 93 and 94 have a relative conductance ratio of 4:2:1. Similarly, the feedback resistances 177 and 178 in resistance network 44′ have a conductance ratio of 2:1. In a similar manner, the resistances 171, 176 and 180 used in connection with the vertical signal path 82 for the reference signal $V_T$ have a relative conductance ratio of 1:2:4. Those skilled in the art will appreciate that the resistance elements 171–181 are preferably made from precision resistors, each of which has a predetermined value such that within each resistance network the conductance ratio between the inputs of the network varies as a power of two in the manner just described. Also, it should be appreciated that the summing networks produce a weighted sum of input values at the input section of their respective comparators.

Figure 8:
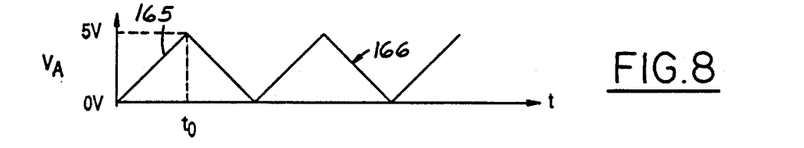
FIG. 8 is a triangular waveform used an analog input voltage to test a prototype converter of the present invention constructed as shown in FIG. 6.

Our prototype circuit 160 shown in FIG. 6 has successfully digitized analog input signals have a frequency of 1 KHz (i.e., in FIGS. 7 and 8, $t_O$=0.5 milliseconds). It is expected that a 4-bit A/D converter of the present invention, once embodied in integrated circuit form fabricated from a wafer of single-crystal silicon semiconductor material using conventional integrated circuit processing techniques, will accurately convert any given analog input signal in one microsecond, and perhaps in considerably less time.

Figure 9:
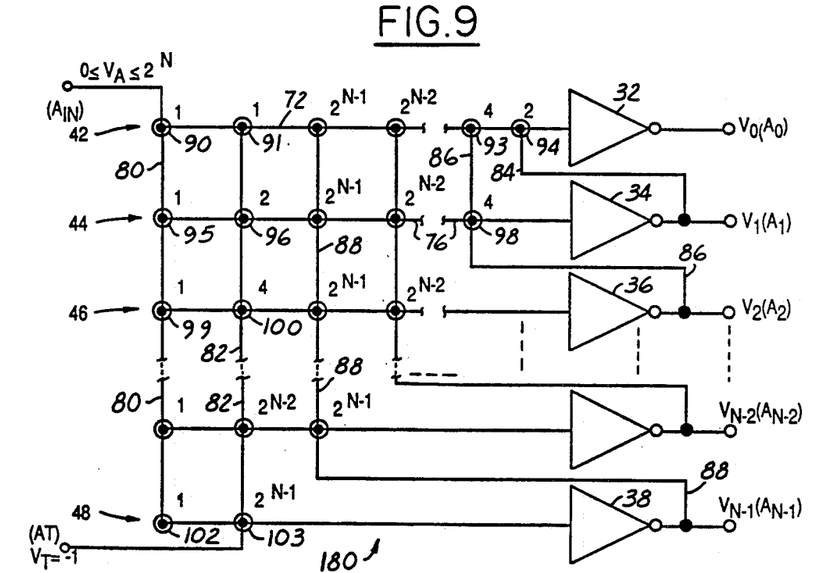
FIG. 9 is a stylized schematic diagram of a third embodiment of the present invention which is identical to the first embodiment except that it has been generalized to N bits and utilizes N comparators and N summing networks.

FIG. 9 is a generalized version of the parallel A/D converter 180 of present invention suitable for N bits resolution. The converter 180 includes N comparators and N summing networks. From FIG. 9, it is possible to develop generalized equations which explain the various relations and further illustrate the design principles of the A/D converters of the present invention. In this regard, it is worth noting that the overall design effectively takes all of the higher digit outputs such as $A_1$, $A_2$, ..., $A_{N-2}$ and $A_{N-1}$, and through the operation of the multiplication junctions, converts these outputs back into an analog voltage which is subtracted through the summing networks before being presented to the inputs of the respective comparators. At the same time, the analog input signal $A_{IN}$ is added by the summing networks to the other values being presented on the horizontal conductors or lines before being presented to the inputs of the respective comparators. The switch point for each comparator between its two output states is determined by its threshold voltage which is set according to the desired input-output waveform of the A/D converter. As shown in FIG. 3, the waveform may be set to switch precisely at a zero volt input, or may be adjusted to the left, as indicated by dashed line 182, or to the right, as indicated by dashed line 184, by any desired fraction of a volt. The amount of offset will typically be no more than half the value of one bit of resolution of the input signal.

The threshold voltage provided to summing network 48 by the voltage at the Nth comparator's input, denoted $V_{T(N)}$, is set to $2^{N-1}$, as indicated at junction 103 in FIG. 9. Accordingly, as explained with respect to FIG. 5, the comparator 38, which represents the most significant bit, will always give the correct output.

The relationship between the analog input signal $V_A$ (or $A_{IN}$) and its digital equivalent $A_{N-1}$, $A_{N-2}$, ..., $A_1$, $A_0$ is given by the following expression:

$$V_A = A_{N-1}*2^{N-1} 30 A_{N-2}*2^{N-2} + \ldots + A_1*2 + A_0 \quad (1)$$

The threshold voltage $V_{T(M)}$ at the Mth comparator's input is set to $2^M$. From the circuit 180 we know that the highest digit comparator 38 always gives correct output. Suppose all the digital outputs of the comparators higher than M have taken the correct values, i.e., $VN_{N-1} = A_{N-1}$, $VN_{N-2} = AN_{N-2}$, ..., $V_{M+1} = A_{M+1}$. From the circuit 180 in FIG. 7 and equation 1, the input voltage $V_{IN(M)}$ at comparator M $IN_{(M)}$ equals $$V_{IN(M)} = V_A - (A_{N-1}*2^{N-1} + A_{N-2}*2^{N-2} + \ldots + A_{M+1}*2^{M+1}) - V_{T(M)} \quad (2)$$

$$V_{IN(M)} = A_M*2^M + A_{M-1} + \ldots + A_1*2 + A_0 - 2^M \quad (3)$$

$$V_{IN(M)} = (A_M - 1)*2^M + A_{M-1}*2^{M-1} + \ldots + A_1*2 + A_0).$$

It can be seen from equation 4 that the polarity of this input voltage is determined only by $A_M$. That is, if $A_M = 0$, then $V_{IN(M)}$ will be less than zero, since the absolute value of $2^M$ is greater than the remaining terms on the right-hand side of the equation 4. If $A_M = 1$, then the remaining terms on the right-hand side of equation 4 will be greater than or equal to zero. Accordingly, this comparator M will take this polarity as its output which is the correct output for this digit. In a similar manner, every comparator in the converter 180 gives a correct output. Using the same design principle above, we can also design an A/D converter with comparators of the differential input type and analog input voltage $V_A$ changing from $-V_R/2$ to $V_R/2$ instead of 0 to $V_R$, where $V_R$ is the range of $V_A$.

Those skilled in the art will appreciate that the parallel A/D comparators of the present invention process signals rapidly and are simple in design. As shown in the second embodiment, the comparator as well as the summing network of each stage may be directly connected to the terminal receiving the analog input signal if desired, so that all comparators receive the incoming analog signal virtually simultaneously Also, the input voltages for all comparators other than the comparator of the most significant bit are determined not just by the analog input signal $A_{IN}$, but also by the binary output generated by comparators of more significant outputs so that the entire signal conversion occurs essentially at the signal propagation speed through the comparators. Accordingly, no clock or other tuning signal is required.

The A/D converters of the present invention are preferably embodied as an integrated circuit on a single chip. If desired, an output latch may also be provided on the chip to capture and hold binary output data of an A/D converter of the present invention. Since the design of the present invention requires few active components, such as transistors, the reliability of the converters is enhanced. Since relatively few components are required, the present A/D converter is particularly well suited for integrated circuit fabrication. Also, resistance elements other than resistors may be used to perform the multiplication function. For example, those in the art will appreciate that in certain applications it i possible to utilize capacitor networks to generate the desired impedances which will perform the same function as resistors, particularly where the slew rate of the analog input signal are relatively high.

From the foregoing description, it should be appreciated that the A/D converter structures and methods disclosed herein are well-suited to achieve the objects above stated. It is recognized that those skilled in the art may make various modifications or additions to the preferred embodiments chosen to illustrate the invention without departing from the spirit and the scope of the present contribution to the art. In addition to the modifications mentioned above, the level of reference signal $A_T$ may be changed with appropriate modification to the multiplier values at the multiplication junctions to which that signal is provided. Also, the digital output may be in the form of a current, and such output current may be sourced, sinked or shut off. Similarly, the analog input signal $A_{IN}$ may be a current, provided appropriate modifications are made to the A/D circuit converters of the present invention. Accordingly, it is to be understood that the present invention is not limited to the specific embodiments chosen to illustrate the invention, but should be deemed to extend to the subject matter defined by the appended claims, including all fair equivalents thereof.

We claim:

1. An asynchronous analog-to-digital converter for producing at least four binary outputs $A_0$ through $A_3$ in parallel from an analog input signal and a reference signal, the converter comprising:

at least first, second, third and fourth comparators respectively having and producing at least four binary outputs $A_0$, $A_1$, $A_2$ and $A_3$, where output $A_0$ and output $A_3$ are respectively the most significant and the least significant of the four binary outputs, each such comparator having a first input and a second input, each of such first inputs receiving the analog input signal, and the second input of the fourth comparator receiving the reference signal;

a first resistance network having an output mode $N_0$ connected to the second input of the first comparator, having four input nodes, and having four resistance elements each connected on one side thereof to the node $N_0$ and on the other side thereof respectively to a distinct one of these four input nodes, which four input nodes are respectively connected to the reference signal and outputs $A_1$, $A_2$ and $A_3$;

a second resistance network having an output node $N_1$ connected to the second input of the second comparator, having three input nodes, and having three resistance elements each connected on one side thereof to the node $N_1$ and on the other side thereof respectively to a distinct one of these three input nodes, which three input nodes are respectively connected to the reference signal and outputs $A_2$ and $A_3$; and a third resistance network having an output mode $N_2$ connected to the second input of the third comparator, having two input nodes, and having two resistance elements each connected on one side thereof to the node $N_2$ and on the other side thereof respectively to a distinct one of these two input nodes, which two input nodes are respectively connected to the reference signal and output $A_3$.

2. A converter as in claim 1, wherein:
the analog input signal is a voltage signal and the reference voltage signal is a fixed voltage signal.

3. A converter as in claim 1, wherein:
the outputs $A_0$ through $A_3$ are negative true logic outputs, and in each comparator the first input constitutes a positive input of the comparator and the second input constitutes the negative input of the comparator.

4. A converter as in claim 1, wherein the three resistance elements of the first resistance network respectively connected to the outputs $A_1$, $A_2$ and $A_3$ have a conductance ratio of 2:4:8.

5. A converter as in claim 1, wherein the two resistance elements of the second resistance network respectively connected to the outputs $A_2$ and $A_3$ have a conductance ratio of 4:8.

6. A converter as in claim 1, wherein the resistance elements of the first, second and third resistance networks connected to the reference signal have different resistance values which permit the relative contribution made by the reference signal through each such element to vary such that the relative conductance ratio produced by such elements is 1:2:4.

7. A converter as in claim 1, wherein the resistance elements of the resistance networks are precision resistors, each of which has a predetermined value such that within each resistance network the conductance ratio between the inputs of the network varies as a power of two.

8. An analog-to-digital converter for producing at least N binary outputs $A_0$ through $A_{N-1}$ in parallel representing a digital value which has a maximum possible value expressible with N bits and which is equivalent to the value of an analog input signal provided to the converter, N being a positive integer having a value of at least three, the converter comprising:

N comparator means for respectively producing binary outputs $A_0$ through $A_{N-1}$, wherein output $A_0$ is the least significant output and output $A_{N-1}$ is the most significant output, and each such comparator means has input means for receiving an analog signal; and at least $N-1$ summing means for producing analog signals, each such summing means producing an analog signal equal to a weighted sum of input signals received thereby, and associated with and having its analog signal connected to the input means of a respective distinct one of the comparator means, the analog signal produced by each such summing means including a predetermined portion of the analog input signal, a predetermined portion of a reference signal, and a predetermined portion of each binary output from only those comparator means whose binary outputs are more significant than the binary output of the comparator means to which the summing means is connected.

9. A converter as in claim 8, wherein in each summing means, the predetermined portions of each binary output included as part of the weighted sum produced by the summing means vary as a power of two relative to one another.

10. A converter as in claim 9, wherein in each summing means, when the predetermined weight of the analog input signal is deemed to be unity, the predetermined portion of the reference signal is directly proportional to the relative significance of the binary output of the comparator means to which the summing means is connected.

11. A converter as in claim 10, wherein the analog input signal has a predetermined nominal range, and the reference signal has a value substantially equal in magnitude to the midpoint value of the nominal range of the analog input signal.

12. A converter as in claim 8, wherein each of the summing means associated with at least a plurality of the comparator means includes a plurality of inputs, with each such input being connected to an impedance element of predetermined value to establish a predetermined ratio of conductance values between the inputs of each summing means which vary as a power of two.

13. A converter as in claim 8, wherein each of the summing means includes a plurality of impedance elements, and each of the inputs of the summing means is designed to receive a voltage signal and is connected to one of the impedance elements of the summing means, and each summing means is designed to sum such voltage signals received at the inputs thereof by allowing such voltage signals to influence in proportion to conductance values of the respective impedance elements the value of the weighted sum to which the analog signal produced by the summing means is equal.

14. A converter as in claim 13, wherein each of the comparator means includes a comparator having a binary output which is essentially always either in a low state or a high state, and has a predetermined input threshold value against which the input signal received by the comparator is compared to determine whether the binary output of the comparator should be in its high state or in its low state.

15. A converter as in claim 14, wherein the output of each of the comparator means other than the comparator means producing the output $A_0$ is delivered to the summing means associated with all comparator means whose outputs are less significant than that of the comparator means in question.

16. A method of asynchronously producing from N comparators N bits of digital output $A_0$ through $A_{N-1}$ in parallel representing an analog input signal delivered to at least $N-1$ summing networks connected to the comparators, the method comprising the steps of:
   (a) delivering the analog input signal to a first input of each of the $N-1$ summing networks;
   (b) delivering a reference signal to a second input of each of the $N-1$ summing networks;
   (c) delivering $N-1$ feedback signals corresponding to the states of the outputs $A_1$ through $A_{N-1}$ to selected inputs of the $N-1$ summing networks such that each summing network receives only those feedback signals which originate from comparators whose outputs are more significant than the output of the comparator to which the summing network is connected.
   (d) producing from each one of the $N-1$ summing networks an analog output representing a weighted sum of input signals received thereby; and
   (e) delivering each such analog output from one of the $N-1$ summing networks to a respective one of the first through $N-1$ comparators,
   whereby the N comparators produce in parallel N bits of digital output $A_0$ through $A_{N-1}$ which digitally represent the value of the analog input signal.

17. A method as in claim 16, wherein the reference signal is a voltage signal and the input signal is a voltage signal.

18. A method as in claim 16, wherein each such feedback signal originating from a comparator in accordance with step (c) is the digital output signal of such comparator.

19. A method of asynchronously producing N bits of digital output $A_0$ through $A_{N-1}$ in parallel representing an analog input signal by using N comparators and at least $N-1$ summing networks connected to the comparators, the method comprising the steps of:
   (a) delivering the analog input signal to a first input of each of the N comparators;
   (b) delivering a reference signal to a first input of each of the $N-1$ summing networks;
   (c) delivering $N-1$ feedback signals corresponding to the states of the outputs $A_1$ through $A_{N-1}$ to selected inputs of the $N-1$ summing networks such that each summing network receives only those feedback signals which originate from comparators whose outputs are more significant than the output of the comparator to which the summing network is connected;
   (d) producing from each one of the $N-1$ summing networks an analog output representing a weighted sum of input signals received thereby; and
   (e) delivering each such analog output from one of the $N-1$ summing networks to a second input of a respective one of the first through $N-1$ comparators,
   whereby the N comparators produce in parallel N bits of digital output $A_0$ through $A_{N-1}$ which digitally represent the value of the analog input signal.

20. A method as in claim 19, wherein the reference signal is a voltage signal and the input signal is a voltage signal.

21. A method as in claim 19, wherein each such signal originating from a comparator in accordance with step (c) is the digital output signal of such comparator.

* * * * *

UNITED STATES PATENT AND TRADEMARK OFFICE
CERTIFICATE OF CORRECTION

PATENT NO. : 4,965,579

DATED : October 23, 1990

INVENTOR(S) : G. Liu et al

It is certified that error appears in the above-identified patent and that said Letters Patent is hereby corrected as shown below:

Column 2, line 19, delete "4,718,591" and insert --- 4,719,591 ----.

Column 2, line 44, delete "4,719.591" and insert ---- 4,719,591 ----.

Column 2, line 51, delete "Science" and insert ---- *Science* ----.

Column 4, line 28, delete "A$_2$and" and insert ---- A$_2$ and ----.

Column 4, line 34, delete "A$_2$and" and insert ---- A$_2$ and ----.

Column 5, line 7, after "levels" insert a semi-colon ---- ; ----.

Column 5, line 18, delete "VA" and insert ---- V$_A$ ----.

Column 5, line 35, delete "VA" and insert ---- V$_A$ ----.

Column 5, line 36, delete "24" and insert ---- $2^4$ ----; same line after ")" insert a period ---- . ----.

Column 6, line 6, delete "junction" and insert ---- junctions ----.

Column 7, line 3, delete "*through V3*" and insert ---- through V$_3$ ----.

Column 7, line 62, delete "was" and insert ---- has ----.

Column 9, line 8, after "of" insert ---- the ----

UNITED STATES PATENT AND TRADEMARK OFFICE
CERTIFICATE OF CORRECTION

PATENT NO. : 4,965,579

DATED : October 23, 1990

INVENTOR(S) : G. Liu et al

It is certified that error appears in the above-identified patent and that said Letters Patent is hereby corrected as shown below:

Column 9, line 45, delete "30" and insert ---- + ----.

Column 9, line 52, delete "VN$_{N-1}$" and insert ---- V$_{N-1}$ ----; same line, delete "VN$_{N-2}$" and insert ---- V$_{N-2}$ ----; same line, delete "AN$_{N-2}$" and insert ---- A$_{N-2}$ ----.

Column 9, line 55, delete "IN$_{(M)}$".

Column 9, line 61, delete "$_{M-1}$+" and insert ---- $_{M-1}$*2$^{M-1}$+ ----.

Column 9 line 64, after "+", fourth occurrence, delete the last term and insert ---- A$_0$ ----.

Column 10, line 19, after "simultaneously" insert a period ---- . ----.

Column 10, line 41, delete "i" and insert ---- is ----.

UNITED STATES PATENT AND TRADEMARK OFFICE
CERTIFICATE OF CORRECTION

PATENT NO. : 4,965,579

DATED : October 23, 1990

INVENTOR(S) : G. Liu et al

It is certified that error appears in the above-identified patent and that said Letters Patent is hereby corrected as shown below:

In the Claims

Column 11, line 32, delete "mode" and insert ---- node ----.

Column 13, line 25, delete "$N_{-1}$" and insert ---- N-1 ----.

Column 14, line 19, delete "$N_{-1}$" and insert ---- N-1 ----.

Signed and Sealed this

Twenty-second Day of March, 1994

Attest:

BRUCE LEHMAN

Attesting Officer

Commissioner of Patents and Trademarks